US011258027B2

(12) United States Patent
Li

(10) Patent No.: US 11,258,027 B2
(45) Date of Patent: Feb. 22, 2022

(54) QUANTUM DOT ARRAY SUBSTRATE HAVING PHOTOSENSITIVE LIGAND BONDED TO QUANTUM DOT AND MANUFACTURING METHOD THEREFOR, AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventor: Dong Li, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/765,847

(22) PCT Filed: Oct. 24, 2019

(86) PCT No.: PCT/CN2019/112919
§ 371 (c)(1),
(2) Date: May 20, 2020

(87) PCT Pub. No.: WO2020/083325
PCT Pub. Date: Apr. 30, 2020

(65) Prior Publication Data
US 2020/0343467 A1    Oct. 29, 2020

(30) Foreign Application Priority Data

Oct. 25, 2018  (CN) .......................... 201811249051.2

(51) Int. Cl.
*H01L 29/08*    (2006.01)
*H01L 51/50*    (2006.01)
(Continued)

(52) U.S. Cl.
CPC ........ *H01L 51/502* (2013.01); *H01L 27/3246* (2013.01); *H01L 51/5072* (2013.01);
(Continued)

(58) Field of Classification Search
CPC ..................................................... H01L 51/502
See application file for complete search history.

(56) References Cited

U.S. PATENT DOCUMENTS

2016/0247861 A1    8/2016  Kim
2016/0293682 A1    10/2016 Park
(Continued)

FOREIGN PATENT DOCUMENTS

CN    103915482 A    7/2014
CN    104979375 A    10/2015
(Continued)

OTHER PUBLICATIONS

First Office Action for related CN App No. 201811249051.2 dated Mar. 4, 2020. English translation provided; 17 pages.
(Continued)

*Primary Examiner* — Caleb E Henry
(74) *Attorney, Agent, or Firm* — Procopio, Cory, Hargreaves & Savitch LLP

(57) ABSTRACT

A method of manufacturing an array, substrate includes: providing a base; forming, on a side of the base, a plurality of quantum dot light-emitting layers arranged in an array, the plurality of quantum dot light-emitting layers being separated from each other by a plurality of first spaces, there being a corresponding one of the plurality of first spaces between every two adjacent quantum dot light-emitting layers of the plurality of quantum dot light-emitting layers, and the plurality of first spaces being communicated with each other; and forming a pixel defining layer in the plurality of first spaces.

17 Claims, 7 Drawing Sheets

(51) Int. Cl.
*H01L 27/32* (2006.01)
*H01L 51/56* (2006.01)

(52) U.S. Cl.
CPC .......... *H01L 51/5092* (2013.01); *H01L 51/56* (2013.01); *H01L 2227/323* (2013.01)

(56) References Cited

U.S. PATENT DOCUMENTS

| | | |
|---|---|---|
| 2017/0141167 A1* | 5/2017 | Naganuma ............ H01L 27/326 |
| 2017/0170241 A1* | 6/2017 | Huang .............. G02F 1/133512 |
| 2017/0194602 A1 | 7/2017 | Cui et al. |
| 2018/0033967 A1 | 2/2018 | Bang et al. |
| 2018/0062101 A1* | 3/2018 | Li .......................... H01L 21/82 |
| 2020/0343467 A1 | 10/2020 | Li |

FOREIGN PATENT DOCUMENTS

| | | | |
|---|---|---|---|
| CN | 105723541 A | 6/2016 | |
| CN | 107665916 A | 2/2018 | |
| CN | 109346506 A | 2/2019 | |

OTHER PUBLICATIONS

Second Office Action for related CN App. No. 201811249051.2 dated Nov. 13, 2020. English translation provided; 16 pages.

\* cited by examiner

QUANTUM DOT ARRAY SUBSTRATE HAVING PHOTOSENSITIVE LIGAND BONDED TO QUANTUM DOT AND MANUFACTURING METHOD THEREFOR, AND DISPLAY DEVICE

CROSS-REFERENCE TO RELATED APPLICATIONS

This application is a national phase entry under 35 USC 371 of International Patent Application No. PCT/CN2019/112919 filed on Oct. 24, 2019, which claims priority to Chinese Patent Application No. 201811249051.2 filed with the Chinese Patent Office on Oct. 25, 2018, titled "ARRAY SUBSTRATE AND METHOD OF MANUFACTURING THE SAME. AND DISPLAY PANEL", which are incorporated herein by reference in their entirety.

TECHNICAL FIELD

The present disclosure relates to the field of display technologies, and in particular, to an array substrate and a method of manufacturing the same, and a display device.

BACKGROUND

With the rapid development of quantum dot materials, quantum dot light-emitting devices (QLEDs) have made rapid progress. Furthermore, with the increase of consumption level of consumers, high-resolution products have become one of the important development directions of display products.

SUMMARY

In one aspect, a method of manufacturing an array substrate is provided. The method of manufacturing an array substrate includes: providing a base; forming, on a side of the base, a plurality of quantum dot light-emitting layers arranged in an array, wherein the plurality of quantum dot light-emitting layers are separated from each other by a plurality of first spaces, there is a corresponding one of the plurality of first spaces between every two adjacent quantum dot light-emitting layers of the plurality of quantum dot light-emitting layers, and the plurality of first spaces are communicated with each other; and forming a pixel defining layer in the plurality of first spaces.

In some embodiments, forming the plurality of quantum dot light-emitting layers, includes: forming, on a side of the base, a quantum dot film, and patterning the quantum dot film to form the plurality of quantum dot light-emitting layers.

In some embodiments, exposing by using a mask to form the plurality of quantum dot light-emitting layers, includes: forming, on a side of the base, a quantum dot film by using a photosensitive quantum dot material; and exposing the quantum dot film by using a mask, and developing the exposed quantum dot film to obtain the plurality of quantum dot light-emitting layers.

In some embodiments, the photosensitive quantum dot material includes a plurality of quantum dots and a plurality of photosensitive ligands respectively bonded to the plurality of quantum dots. One of the plurality of photosensitive ligands includes at least one of an alkenyl group, an alkynyl group, a phenyl group, a sulfhydryl group, or a hydroxyl group; or, one of the plurality of photosensitive ligands includes at least one of a carbonyl group or an epoxy group.

In some embodiments, in a case where one of the plurality of photosensitive ligands includes at least one of an alkenyl group, an alkynyl group, a phenyl group, a sulfhydryl group, or a hydroxyl group, a chemical structural formula of the photosensitive ligand includes at least one of:

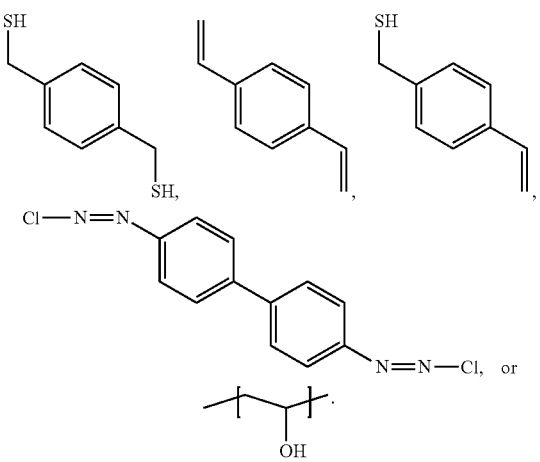

In a case where one of the plurality of photosensitive ligands includes at least one of a carbonyl group or an epoxy group a chemical structural formula of the photosensitive ligand includes:

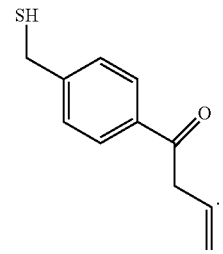

In some embodiments, patterning the quantum dot film to form the plurality of quantum dot light-emitting layers, includes: forming, on a side of the base, a quantum dot film by using a non-photosensitive quantum dot material; forming a first photoresist layer on a surface of the quantum dot film facing away from the base; exposing the first photoresist layer by using a mask, and developing the exposed first photoresist layer to form a patterned first photoresist layer; and etching the quantum dot film by using the patterned first photoresist layer as a mask to obtain the plurality of quantum dot light-emitting layers.

In some embodiments, before forming, on a side of the base, a plurality of quantum dot light-emitting layers arranged in an array, the method further includes; forming, on a side of the base, a plurality of first electrodes that are disposed between the base and the plurality of quantum dot light-emitting layers to be formed and are in one-to-one correspondence with the quantum dot light-emitting layers to be formed. After forming a pixel defining layer in the plurality of first spaces, the method further includes: forming a second electrode on a side of each quantum dot light-emitting layer facing away from the base.

In some embodiments, forming a pixel defining layer in the plurality of first spaces, includes: forming a first pixel defining sub-layer in the plurality of first spaces, wherein the first pixel defining sub-layer is separated from the plurality of quantum dot light-emitting layers by a plurality of second spaces, there are some of the plurality of second spaces between the first pixel defining sub-layer and each quantum dot light-emitting layer, a distance from a surface of the first pixel defining sub-layer facing away from the base to the base is greater than or equal to a distance from a surface of the quantum dot light-emitting layer facing away from the base to the base, and a material for the first pixel defining sub-layer includes an opaque material; and forming a second pixel defining sub-layer in the plurality of second spaces, wherein a material for the second pixel defining sub-layer includes an insulating material.

In some embodiments, the opaque material for the first pixel defining sub-layer includes an opaque metal material, the first pixel defining sub-layer is separated from the plurality of first electrodes by a plurality of third spaces, and there are some of the plurality of third spaces between the first pixel defining sub-layer and each first electrode. Forming a second pixel defining sub-layer in the plurality of second spaces, includes: forming a second pixel defining sub-layer in the plurality of third spaces and in the plurality of second spaces.

In some embodiments, the opaque material for the first pixel defining sub-layer includes an opaque metal material, the first pixel defining sub-layer is separated from the plurality of first electrodes by a plurality of third spaces, and there are some of the plurality of third spaces between the first pixel defining sub-layer and each first electrode. Forming a second pixel defining sub-layer in the plurality of second spaces, includes: forming a second pixel defining sub-layer in the plurality of third spaces, in the plurality of second spaces, and on the surface of the first pixel defining sub-layer facing away from the base.

In some embodiments, forming a pixel defining layer in the plurality of first spaces, further includes: forming a third pixel defining sub-layer in the plurality of first spaces, wherein a material for the third pixel defining sub-layer includes an insulating material. Forming a first pixel defining sub-layer in the plurality of first spaces, includes: forming a first pixel defining sub-layer in the plurality of first spaces and on a side of the third pixel defining sub-layer facing away from the base, wherein the first pixel defining sub-layer covers an outer surface of the third pixel defining sub-layer.

In some embodiments, after forming the plurality of first electrodes, and before forming the plurality of quantum dot light-emitting layers, the method further includes: forming a first function layer on a side of each first electrode facing away from the base. After forming the plurality of quantum dot light-emitting layers, and before forming the plurality of second electrodes, the method further includes: forming a second function layer on a side of each quantum dot light-emitting layer facing away from the base.

In some embodiments, at least one of the first function layer or the second function layer includes a photosensitive function layer. Forming the photosensitive function layer includes: forming a photosensitive function film, and patterning the photosensitive function film by using photolithography to form the photosensitive function layer.

In some embodiments, the first function layer includes at least one of an electron injection layer or an electron transport layer, and the second function layer includes at least one of a hole injection layer or a hole transport layer; or, the first function layer includes at least one of a hole injection layer or a hole transport layer, and the second function layer includes at least one of an electron injection layer or an electron transport layer. Forming a second function layer on a side of each quantum dot light-emitting layer facing away from the base, includes: forming, by evaporation, a second function layer on a side of each quantum dot light-emitting layer facing away from the base.

In another aspect, an array substrate is provided. The array substrate is manufactured by the method in the above embodiments. The array substrate includes: a base; a plurality of quantum dot light-emitting layers arranged in an array, which are disposed on a side of the base, wherein the plurality of quantum dot light-emitting layers are separated from each other by a plurality of first spaces, there is a corresponding one of the plurality of first spaces between every two adjacent quantum dot light-emitting layers of the plurality of quantum dot light-emitting layers, and the plurality of first spaces are communicated with each other; and a pixel defining layer disposed in the plurality of first spaces, wherein the pixel defining layer includes a first pixel defining sub-layer and a second pixel defining sub-layer, the first pixel defining sub-layer is separated from the plurality of quantum dot light-emitting layers by a plurality of second spaces, there are some of the plurality of second spaces between the first pixel defining sub-layer and each quantum dot light-emitting layer, and the second pixel defining sub-layer is disposed in plurality of second spaces a material for the first pixel defining sub-layer includes an opaque material, and a material for the second pixel defining sub-layer includes an insulating material: and a distance from a surface of each quantum dot light-emitting layer facing away from the base to the base is less than a distance from a surface of the first pixel defining sub-layer facing away from the base to the base. The quantum dot light-emitting layer includes a plurality of quantum dots and a plurality of photosensitive ligands respectively bonded to the plurality of quantum dots.

In some embodiments, the array substrate further includes a plurality of first electrodes each disposed on a side of a corresponding one of the plurality of quantum dot light-emitting layers proximate to the base. The material for the first pixel defining sub-layer includes an opaque metal material, and the first pixel defining sub-layer is separated from the plurality of first electrodes by a plurality of third spaces, there are some of the plurality of third spaces between the first pixel defining sub-layer and each first electrode The second pixel defining sub-layer is further disposed in the plurality of third spaces.

In some embodiments, the array substrate further includes a plurality of first electrodes each disposed on a side of a corresponding one of the plurality of quantum dot light-emitting layers proximate to the base. The material for the first pixel defining sub-layer includes an opaque metal material, and the first pixel defining sub-layer is separated from the plurality of first electrodes by a plurality of third spaces, there are some of the plurality of third spaces between the first pixel defining sub-layer and each first electrode. The second pixel defining sub-layer is further disposed in the plurality of third spaces and on the surface of the first pixel defining sub-layer facing away from the base.

In some embodiments, the pixel defining layer further includes a third pixel defining sub-layer. A material for the third pixel defining sub-layer includes an insulating material. The first pixel defining sub-layer is disposed on a side of the third pixel defining sub-layer facing away from the base, and the first pixel defining sub-layer covers an outer surface of the third pixel defining sub-layer.

In some embodiments, there is an overlapped region between an orthographic projection of the second pixel defining sub-layer on the base and an orthographic projection of each quantum dot light-emitting layer on the base, and along a direction from one quantum dot light-emitting layer to another quantum dot light-emitting layer adjacent thereto, a dimension of the overlapped region is of 500 nm to 1000 nm, inclusive.

In yet another aspect, a display device is provided. The display device includes the array substrate provided in the above embodiments described above.

BRIEF DESCRIPTION OF THE DRAWINGS

The accompanying drawings illustrated herein, which constitute part of the present disclosure, are used to provide further understanding of the present disclosure, and exemplary embodiments of the present disclosure and the description thereof are used to explain the present disclosure and not intended to inappropriately limit the present disclosure. In the drawings.

DETAILED DESCRIPTION

Figure 1:
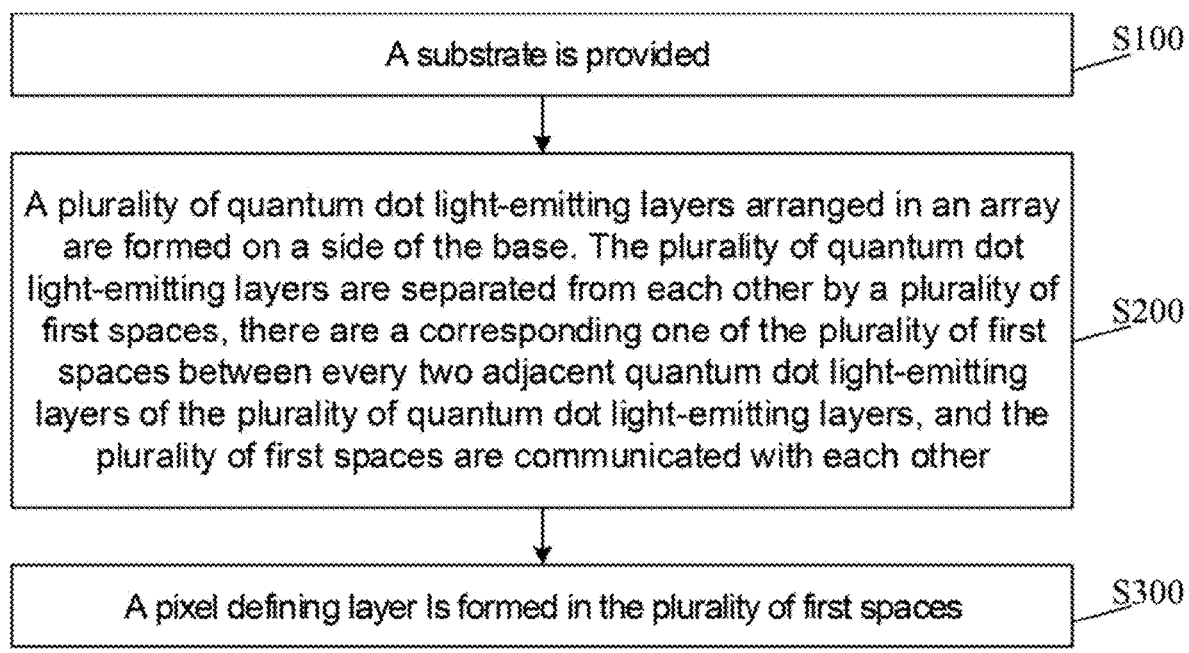
FIG. 1 is a flow diagram showing a method of manufacturing an array substrate, according to some embodiments of the present disclosure.

To further describe the array substrate and the method of manufacturing the same, and the display device provided in some embodiments of the present disclosure, detailed description will be given with reference to the accompanying drawings.

In the related art, due to the characteristics of the quantum dot material itself, it is hard to form quantum dot light-emitting layers by evaporation. Generally, the quantum dot light-emitting layers are formed by inkjet printing. Therefore, in a process of manufacturing a QLED display panel, a pixel defining layer having a plurality of opening regions is formed on a side of a base (each opening region corresponding to one sub-pixel region), and then a quantum dot light-emitting layer is formed in each opening region by the inkjet printing, and then another layer (e.g., an electrode layer) are formed on a side of each quantum dot light-emitting layer facing away from the base.

However, in a process of forming the quantum dot light-emitting layer, ink used to form the quantum dot light-emitting layer easily climbs on a surface of the pixel defining layer in contact with the quantum dot light-emitting layer, or even climbs onto a surface of the pixel defining layer facing away from the base. As a result, the morphology of the formed quantum dot light-emitting layer and the uniformity in its thickness are be greatly affected, which is likely to adversely affect the performance of the QLED and thus affect the yield of the QLED display panel. For a high-resolution QLED display panel, due to a very small space between adjacent sub-pixels in the display panel, a distance between adjacent opening regions in the pixel defining layer is also small. It is more possible for ink of the quantum dot light-emitting layer to climb onto the pixel defining layer. Therefore, the improvement to the yield of the high-resolution QLED display panel may be greatly limited.

Some embodiments of the present disclosure provide an array substrate 100. Referring to FIGS. 5 to 8, the array substrate 100 includes a base 1, a plurality of quantum dot light-emitting layers 2 and a pixel defining layer 3. The plurality of quantum dot light-emitting layers 2 are disposed on a side of the base 1, and arranged in an array. There is a first space A1 between every two adjacent quantum dot light-emitting layers 2 of the plurality of quantum dot light-emitting layers 2, and a plurality of first spaces A1 are communicated with each other to form a grid. The pixel defining layer 3 is disposed in the plurality of first spaces A1, that is, a corresponding part of the pixel defining layer 3 is disposed between any two adjacent quantum dot light-emitting layers 2.

The quantum dot light-emitting layer 2 is made of a photosensitive quantum dot material. That is, the quantum dot light-emitting layer 2 includes a plurality of quantum dots and photosensitive ligands respectively bonded to the plurality of quantum dots. Here, the quantum dots are usually bonded to the photosensitive ligands by coordinate bond.

There are many types of bases 1. The base 1 may be selected according to actual requirements and will not be limited in some embodiments of the present disclosure. In some examples, the base 1 includes a rigid base, for example, a glass base. In other examples, the base 1 includes a flexible base, for example, a polyethylene terephthalate (PET) base, a polyethylene naphthalate (PEN) base or a polyimide (PI) base.

In some embodiments, the array substrate 100 has a plurality of sub-pixel regions B arranged in an array. Each sub-pixel region B corresponds to one quantum dot light-emitting layer 2. Light emitted by the quantum dot light-emitting layer 2 faces the base 1 or faces away from the base 1. That is, the array substrate 100 is a bottom-emitting array substrate or a top-emitting array substrate, correspondingly.

The pixel defining layer 3 is configured to define every two adjacent sub-pixel regions B. The pixel defining layer 3 is grid-like, and filled in the plurality of first spaces A1. In some examples, referring to FIGS. 6 and 7, a boundary of an orthographic projection of the pixel defining layer 3 on the base 1 overlaps with a boundary of an orthographic projection of each quantum dot light-emitting layer 2 on the base 1. In other examples, referring to FIG. 8, there is an overlapped region A4 between an orthographic projection of the pixel defining layer 3 on the base 1 and an orthographic projection of an edge of each quantum dot light-emitting layer 2 on the base 1. That is to say, the pixel defining layer 3 covers at least a part of a periphery of each quantum dot light-emitting layer 2. For example, along a direction from one quantum dot light-emitting layer 2 to another quantum dot light-emitting layer 2 adjacent thereto, a dimension of the overlapped region A4 is of 500 nm to 1000 nm, inclusive.

The quantum dot light-emitting layer 2 has a thickness (i.e., a distance from a surface of the quantum dot light-emitting layer 2 facing away from the base 1 to a surface thereof proximate to the base 1) of 20 nm to 50 nm, inclusive. A distance from a surface of the pixel defining layer 3 facing away from the base 1 to the base 1 is usually greater than a distance from the surface of each quantum dot light-emitting layer 2 facing away from the base 1 to the base 1, so that a cross-color phenomenon may be prevented from occurring between adjacent sub-pixel regions B by the pixel defining layer 3.

Since one color is displayed in each sub-pixel region B, and each quantum dot light-emitting layer 2 emits light in one color, correspondingly. Here, the color of light emitted by each quantum dot light-emitting layer 2 may be, for example, one of red, green or blue; or, the color of light emitted by each quantum dot light-emitting layer 2 may be, for example, one of magenta, cyan, yellow or white. Of course, each quantum dot light-emitting layer 2 may emit light in other colors. It may be selected according to actual requirements and will not be repeated here.

The quantum dots are configured to emit light. The quantum dots may be selected according to actual requirements and will not be limited in some embodiments of the present disclosure. For example, the quantum dots may be quantum dots made from CdSe nanocrystals.

As the characteristic of the quantum dots, the frequency of the emitted light changes as its crystalline grain size changes. In some examples, the quantum dots in different quantum dot light-emitting layer 2 are usually made from a same material having different crystalline grain sizes. For example, in the plurality of quantum dot light-emitting layers 2, the quantum dots in a quantum dot light-emitting layer 2 configured to emit red light, the quantum dots in a quantum dot light-emitting layer 2 configured to emit green light, and the quantum dots in a quantum dot light-emitting layer 2 configured to emit blue light are all made from CdSe nanocrystals, and the CdSe nanocrystals corresponding to different types of quantum dots have different crystalline grain sizes.

The photosensitive ligands are sensitive to light. That is, the photosensitive ligands may be, when irradiated by light (e.g., UV light), cured or degraded according to the used material. Exemplarily, a material for the photosensitive ligands includes a photo-curable material, for example, the photo-curable material includes at least one of an alkenyl group, an alkynyl group, a phenyl group, a sulfhydryl group or a hydroxyl group; or, the material for the photosensitive ligands includes a photo-degradable material, for example, the photo-degradable material includes at least one of a carbonyl group or an epoxy group.

The quantum dot light-emitting layer 2 is made from a photosensitive quantum dot material. Therefore, in some embodiments of the present disclosure, the plurality of quantum dot light-emitting layers 2, which are arranged in an array, may be formed by using photolithography, so that the thickness of a peripheral part of each quantum dot light-emitting layer 2 is consistent with the thickness of its central part, and it may be ensured that each quantum dot light-emitting layer 2 has a good morphology.

In some embodiments of the present disclosure, after forming each quantum dot light-emitting layer 2, the pixel defining layer 3 is formed in the plurality of first spaces A1 used to separate every two adjacent quantum dot light-emitting layers 2. In this way, every two adjacent quantum dot light-emitting layers 2 may be separated by the pixel defining layer 3, so as to define each sub-pixel region B.

Therefore, in the array substrate 100 provided in these embodiments of the present disclosure, the non-uniformity in thickness of the quantum dot light-emitting layer 2 because of the climbing of the quantum dot light-emitting layer 2 onto the pixel defining layer 3 may be avoided. Thus, the impact of the non-uniformity in thickness of the quantum dot light-emitting layer 2 on the yield of a QLED display device including the array substrate 100 may be avoided. Furthermore, in a case where the array substrate 100 is applied to a high-resolution QLED display device, no high requirements will be proposed on the precision and stability of apparatuses used for preparing the pixel defining layer 3 because of the climbing of the quantum dot light-emitting layer 2 onto the pixel defining layer 3. Thus, the yield of the high-resolution QLED display device may be increased effectively. Moreover, since the quantum dot light-emitting layer 2 is made of the photosensitive quantum dot material, the quantum dot light-emitting layer 2 may be formed by exposing and developing, which may simplify the preparing processes of the quantum dot light-emitting layer 2 and improve the efficiency in manufacturing the array substrate 100.

In addition, the light emitting of the quantum dot light-emitting layer 2 is usually driven by a driving voltage. That is, by the driving voltage, the quantum dots in the quantum dot light-emitting layer 2 are excited to emit light.

Figure 6:
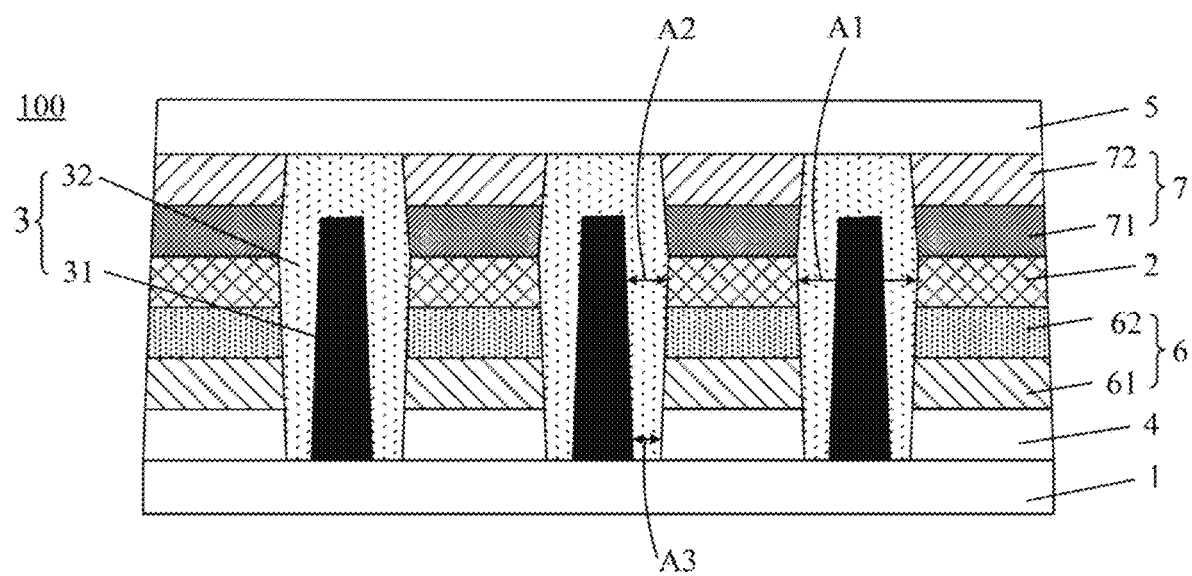
FIG. 6 is a sectional view of the array substrate in FIG. 5 along line C-C'.
Figure 7:
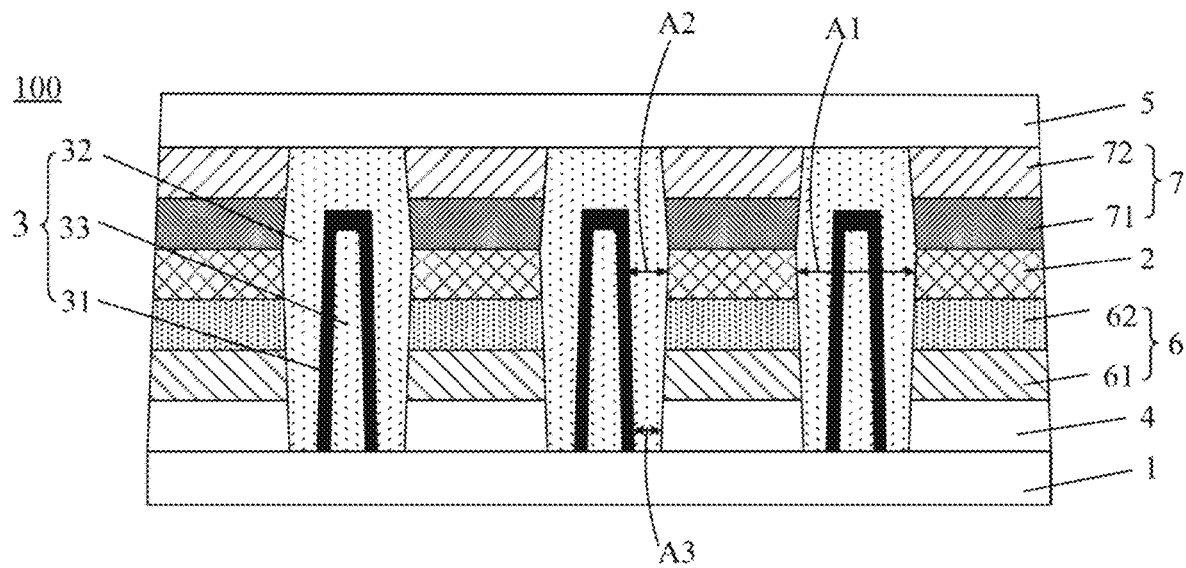
FIG. 7 is another sectional view of the array substrate in FIG. 5 along line C-C'.
Figure 8:
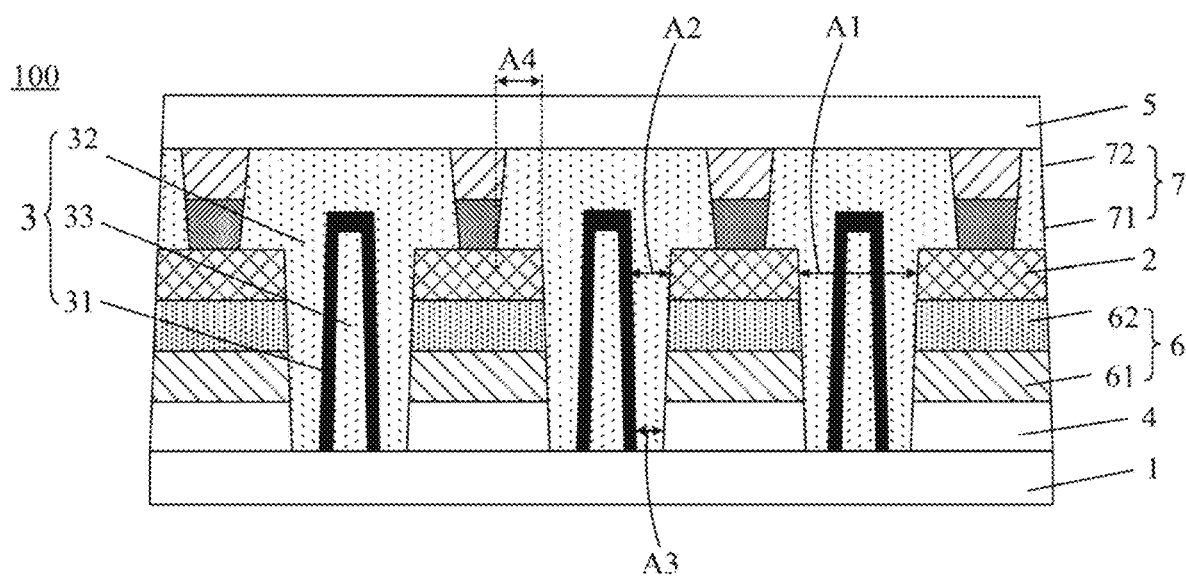
FIG. 8 is yet another sectional view of the array substrate in FIG. 5 along line C-C'.

In some embodiments, referring to FIGS. 6 to 8, the array substrate 100 further includes a first electrode 4 disposed on a side of each quantum dot light-emitting layer 2 proximate to the base 1, and a second electrode 5 disposed on a side of each quantum dot light-emitting layer 2 facing away from the base 1.

The first electrodes 4 are disposed in such a way that every two adjacent first electrodes 4 are disposed independently, that is, every two adjacent first electrodes 4 are not in electrical connection. The second electrodes 5 are disposed in such a way that every two adjacent second electrodes 5 are disposed independently, that is, every two adjacent second electrodes 5 are not in electrical connection. Or, the second electrodes 5 are in electrical connection with each other to form a planar electrode. The second electrode 5 has a thickness (i.e., a distance from a surface of the second electrode 5 proximate to the base 1 to a surface of the second electrode 5 facing away from the base 1) of usually 10 nm to 150 nm, inclusive.

Each first electrode 4 and a corresponding second electrode 5 are opposite in polarity. That is, in some examples, each first electrode 4 is an anode and each second electrode 5 is a cathode, correspondingly; and in other examples, each first electrode 4 is a cathode and each second electrode 5 is an anode, correspondingly.

For example, in a case where each first electrode 4 is an anode, each first electrode 4 is made of indium tin oxide (ITO); or each first electrode 4 includes an ITO layer, an Ag layer and another ITO layer, which are stacked successively. In this case, each second electrode 5 is a cathode, and each second electrode 5 includes a LiF layer and an Al layer, which are stacked successively. Each second electrode 5 may be formed by evaporation.

By supplying a first voltage to each first electrode 4 and a second voltage to the corresponding second electrode 5, a voltage difference (i.e., driving voltage) may be formed between each first electrode 4 and the corresponding second electrode 5. In this way, the corresponding quantum dot light-emitting layer 2 is able to be excited to emit light.

Figure 5:
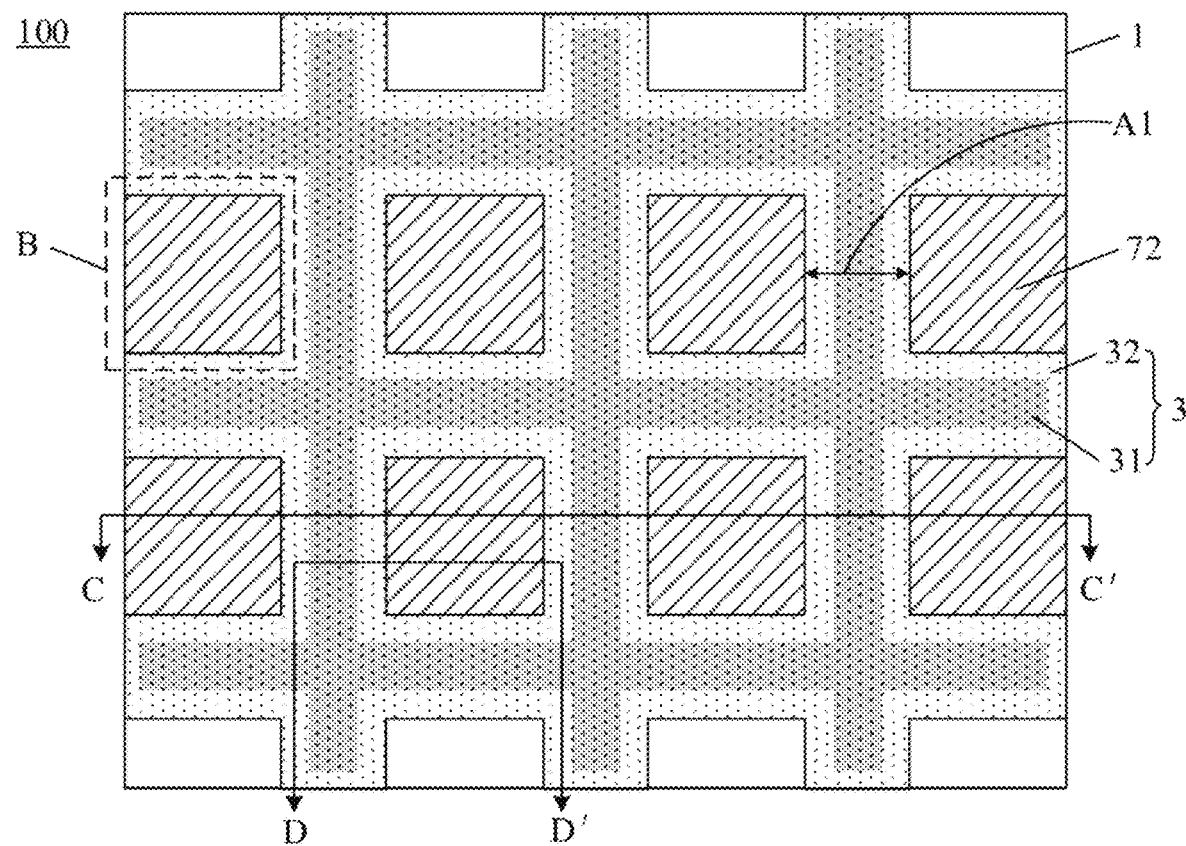
FIG. 5 is a top view of an array substrate, according to some embodiments of the present disclosure.
Figure 11:
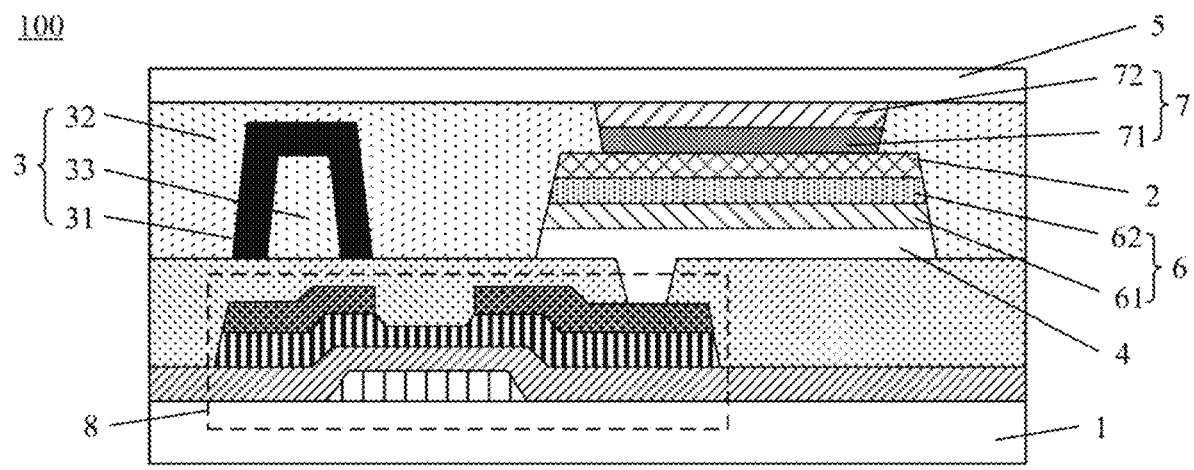
FIG. 11 is a sectional view of the array substrate in FIG. 5 along line D-D'.
Figure 12:
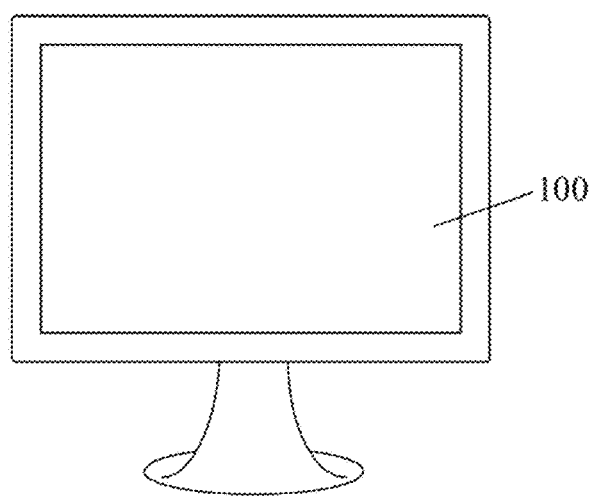
FIG. 12 is a schematic diagram showing a structure of a display device, according to some embodiments of the present disclosure.

In some embodiments, referring to FIGS. 5 and 11, the array substrate 100 further includes a pixel driving circuit that is disposed in each sub-pixel region B and is electrically connected to a corresponding first electrode 4. Each pixel driving circuit includes at least one thin film transistor (TFT) 8 and at least one capacitor. The pixel driving circuit is configured to supply a first voltage to the corresponding first electrode 4, so that the first electrode 4 may coordinate with the corresponding second electrode 5 to drive the corresponding quantum dot light-emitting layer 2 to emit light.

In some embodiments, further referring to FIGS. 6 to 8, the array substrate 100 further includes: a first function layer 6 disposed between each quantum dot light-emitting layer 2 and a corresponding first electrode 4 and a second function layer 7 disposed between each quantum dot light-emitting layer 2 and a corresponding second electrode 5.

A structure of each second function layer 7 is diverse and may be selected according to actual requirements. For example, each second function layer 7 is disposed independently and disposed in one sub-pixel region B; or, the second function layers 7 are connected to each other to form a planar structure that is integrally laid on the surfaces of the plurality of quantum dot light-emitting layers 2 facing away from the base 1.

Here, the first function layer 6 is related to the first electrode 4, and the second function layer 7 is related to the second electrode 5.

In some examples, the first electrode 4 is an anode and the second electrode 5 is a cathode. In this case, the first function layer 6 includes at least one of a first layer 61 or a second layer 62, here, the first layer 61 is a hole injection layer, and the second layer 62 is a hole transport layer; and the second function layer 7 includes at least one of a third layer 71 or a fourth layer 72, here, the third layer 71 is an electron transport layer, and fourth layer 72 is an electron injection layer.

Here, both the first function layer 6 and the second function layer 7 have a thickness of 20 nm to 50 nm, inclusive. In a case where the first function layer 6 includes the hole injection layer and the hole transport layer, and the second function layer 7 includes the electron transport layer and the electron injection layer, the first electrode 4, the hole injection layer, the hole transport layer, the quantum dot light-emitting, layer 2, the electron transport layer, the electron injection layer and the second electrode 5 are stacked successively.

In other examples, the first electrode 4 is a cathode and the second electrode 5 is an anode. In this case, the first function layer 6 includes at least one of a first layer 61 or a second layer 62, here, the first layer 61 is an electron injection layer 61, and the second layer 62 is an electron transport layer; and the second function layer 7 includes at least one of a third layer 71 or a fourth layer 72, here, the third layer 71 is a hole transport layer 71, and the fourth layer 72 is a hole injection layer.

Here, taking the first electrode 4 being an anode and the second electrode 5 being a cathode as an example, the process of driving, by both the first electrode 4 and the second electrode 5, a corresponding quantum dot light-emitting layer 2 to emit light will be described exemplarily. That is, a driving voltage is formed between the first electrode 4 and the second electrode 5. Then, holes in the hole injection layer migrate, when driven by the driving voltage, to the quantum dot light-emitting layer 2 through the hole transport layer; and electrons in the electron injection layer migrate, when driven by the driving voltage, to the quantum dot light-emitting layer 2 through the electron transport layer. By the driving voltage, the holes and electrons are gathered and bonded in the quantum dot light-emitting layer 2 to generate energy by which the quantum dot light-emitting layer 2 is excited to emit light. Furthermore, by controlling the magnitude of the driving voltage, the migration rate of holes and the migration rate of electrons may be controlled, and thus the light emitting efficiency and luminance of the quantum dot light-emitting layer 2 may be controlled.

A structure of the pixel defining layer 3 is diverse and may be selected according to actual requirements, and will not be limited in some embodiments of the present disclosure.

In some embodiments, referring FIGS. 5, 6, 9 and 10, the pixel defining layer 3 includes a first pixel defining sub-layer 31 and a second pixel defining sub-layer 32. There are second spaces A2 between the first pixel defining sub-layer 31 and each quantum dot light-emitting layer 2. The second pixel defining sub-layer 32 is disposed in all second spaces A2.

Since the first pixel defining sub-layer 31 is disposed in the plurality of first spaces A1, and all second spaces A2 are disposed between the first pixel defining sub-layer 31 and each quantum dot light-emitting layer 2, the first pixel defining sub-layer 31 forms a grid, and multiple second spaces A2 around each quantum dot light-emitting layer 2 are communicated with each other to form an annular space.

A structure of the second pixel defining sub-layer 32 is diverse and may be elected according to actual requirements, and will not be limited in some embodiments of the present disclosure.

Figure 9:
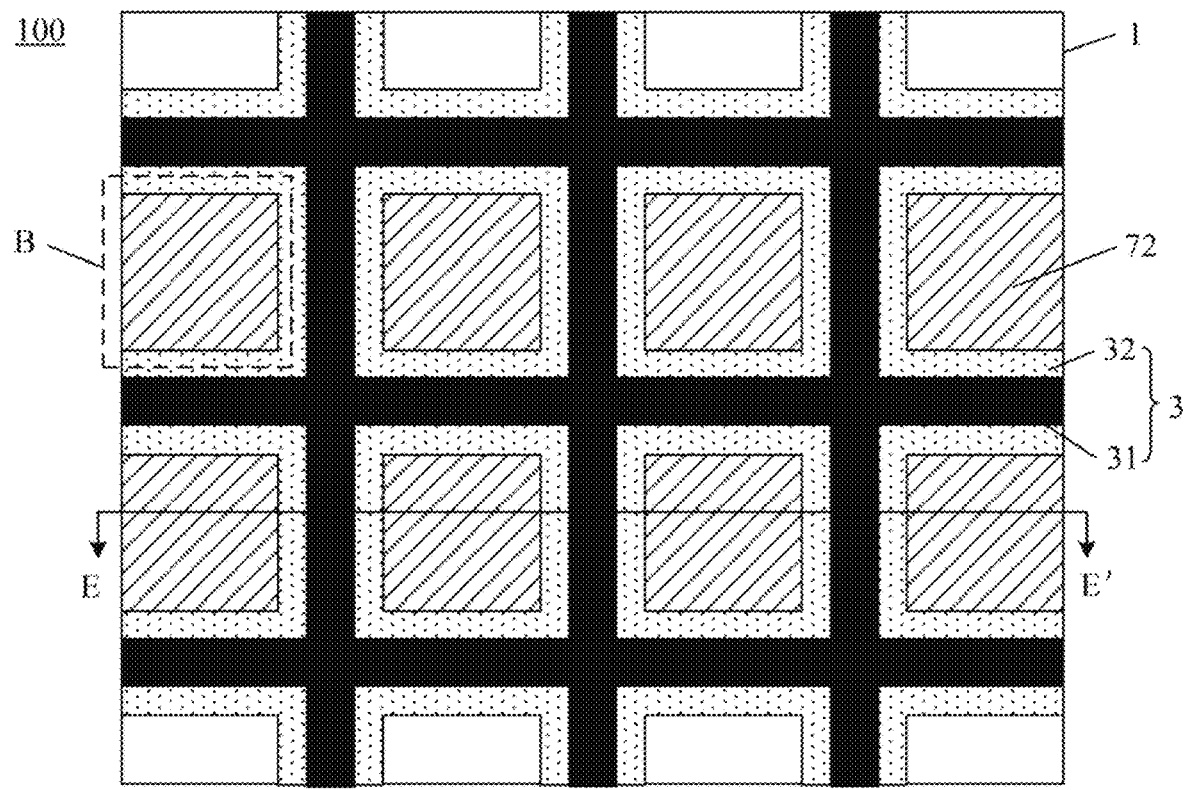
FIG. 9 is a top view of another array substrate, according to some embodiments of the present disclosure.
Figure 10:
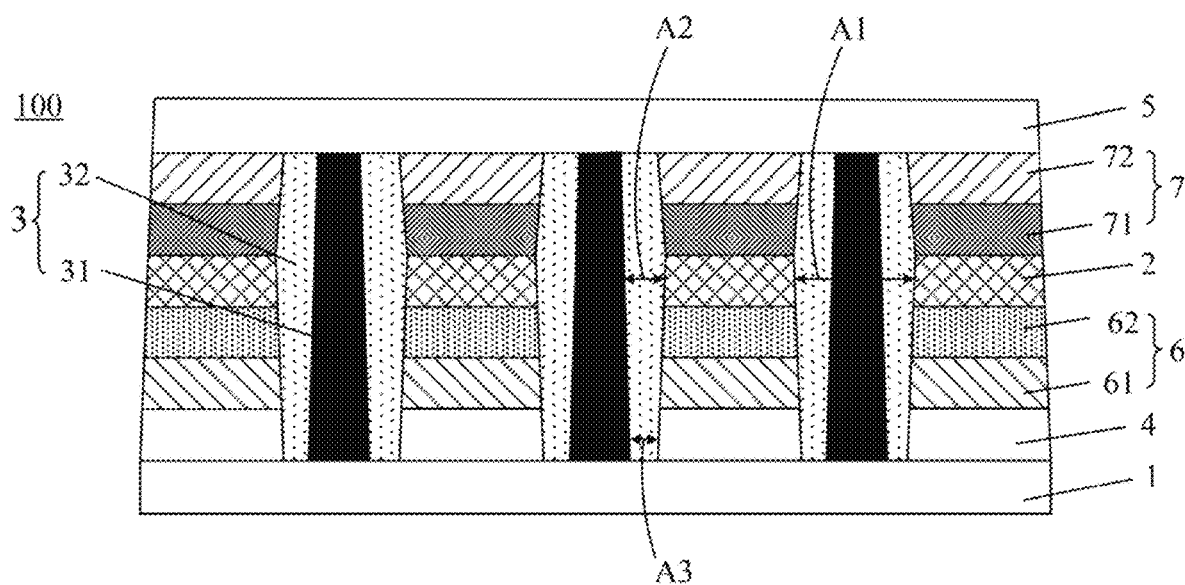
FIG. 10 is a sectional view of the array substrate in FIG. 9 along lien E-E'.

For example, referring to FIGS. 9 and 10, the second pixel defining sub-layer 32 has a split structure. Here, each part of the second pixel defining sub-layer 32 corresponds to one quantum dot light-emitting layer 2 and is annularly filled in each annular space to surround the corresponding quantum dot light-emitting layer 2. In this way, the second pixel defining sub-layer 32 is able to separate the first pixel defining sub-layer 31 from each quantum dot light-emitting layer 2.

For another example, referring to FIGS. 5 and 6, the structure of the second pixel defining sub-layer 32 is disposed in such a way that, the second pixel defining sub-layer 32 is filled in each annular space and also covers a surface of the first pixel defining sub-layer 31 facing away from the base 1. That is, the second pixel defining sub-layer 32 wraps the first pixel defining sub-layer 31 and separates the first pixel defining sub-layer 31 from each quantum dot light-emitting layer 2.

In some examples, the thickness of the second pixel defining sub-layer 32 in a direction parallel to the base 1 (i.e., the distance between the first pixel defining sub-layer 31 and each quantum dot light-emitting layer 2) is set according to actual requirements and will not be limited in some embodiments of the present disclosure. For example, the thickness of the second pixel defining sub-layer 32 in the direction parallel to the base 1 is of 1 μm to 2 μm, inclusive.

The first pixel defining sub-layer 31 includes an opaque layer and the second pixel defining sub-layer 32 includes an insulating layer. The distance from the surface of each quantum dot light-emitting layer 2 facing away from the base 1 to the base 1 is less than the distance from the surface of the first pixel defining sub-layer 31 facing away from the base 1 to the base 1.

The first pixel defining sub-layer 31 is configured to absorb or reflect light emitted by each quantum dot light-emitting layer 2 to quantum dot light-emitting layers 2 adjacent thereto, so as to avoid the cross-color phenomenon between the adjacent sub-pixel regions B. The second pixel defining sub-layer 32 is configured to separate the first pixel defining sub-layer 31 from each quantum dot light-emitting layer 2 and insulate them from each other. Taking the base 1 as the baseline, the thickness of a part of the first pixel defining sub-layer 31 exceeding the quantum dot light-emitting layers 2 is set according to actual requirements and will not be limited in some embodiments of the present disclosure.

Here, whether the first pixel defining sub-layer 31 is configured to absorb light or reflect light depends upon the material used.

In some examples, the first pixel defining sub-layer 31 is made of a highly reflective material (e.g., metal material). In this case, the first pixel defining sub-layer 31 is configured to reflect light. Since the highly reflective material is able to reflect light, light emitted by the quantum dot light-emitting layer 2 in a certain sub-pixel region B may be reflected, after being irradiated on the first pixel defining sub-layer 31, back to this sub-pixel region B by the reflection of the first pixel defining sub-layer 31, so that the reflected light may still be displayed in this sub-pixel region B. In this way, the display brightness of a display picture of the array substrate 100 may be increased.

In other examples, the first pixel defining sub-layer 31 is made of a carbon-containing resin material. In this case, the first pixel defining sub-layer 31 is configured to absorb light. In this way, light emitted by the quantum dot light-emitting layer 2 in a certain sub-pixel region B may be absorbed, after being irradiated on the first pixel defining sub-layer 31, by the first pixel defining sub-layer 31. In this way, the light may be prevented from being irradiated to adjacent sub-pixel regions B.

In some embodiments of the present disclosure, by setting the first pixel defining sub-layer 31 as an opaque layer, and setting the distance from the surface of each quantum dot light-emitting layer 2 facing away from the base 1 to the base 1 to be less than the distance from the surface of the first pixel defining sub-layer facing away from the base 1 to the base 1, it may be effectively ensured that light emitted by each quantum dot light-emitting layer 2 to adjacent quantum dot light-emitting layers 2 is absorbed or reflected by the first pixel defining sub-layer 31. The cross-color phenomenon between the adjacent sub-pixel regions B is avoided. In a case where the array substrate 100 is applied to a display device 200, the impact on the display effect of the display device 200 may be avoided.

In same embodiments of the present disclosure, taking the first pixel defining sub-layer 31 including an opaque metal layer as an example, the structure of the second pixel defining sub-layer 32 is exemplarily described.

In some examples, referring to FIG. 10, the first pixel defining sub-layer 31 includes an opaque metal layer; and there are third spaces A3 between the first pixel defining sub-layer 31 and each first electrode 4, and the second pixel defining sub-layer 32 is further disposed in all third spaces A3. In this way, while separating the first pixel defining sub-layer 31 from each quantum dot light-emitting layer 2 and insulating them from each other by the second pixel defining sub-layer 32, the first pixel defining sub-layer 31 may be separated from and insulated from each first electrode 4 by the second pixel defining sub-layer 32. In this way, the electrical connection of the first pixel defining sub-layer 31 to each first electrode 4 may be avoided.

In other examples, the first pixel defining sub-layer 31 includes an opaque metal layer; and, there are third spaces A3 between the first pixel defining sub-layer 31 and each first electrode 4, and the second pixel defining sub-layer 32 is further disposed in all third spaces A3 and on the surface of the first pixel defining sub-layer 31 facing away from the base 1, that is, the second pixel defining sub-layer 32 completely covers the first pixel defining sub-layer 31. In this way, the first pixel defining sub-layer 31 may be insulated properly by the second pixel defining sub-layer 32, and the electrical connection of electrically a conductive structure in each sub-pixel region B (e.g., each first electrode 4 or each second electrode 5) to the first pixel defining sub-layer 31 may be avoided.

In some embodiments of the present disclosure, there is an overlapped region between an orthographic projection of the pixel defining layer 3 on the base 1 and an orthographic projection of each quantum dot light-emitting layer 2 on the base 1. Here, in a case where the pixel defining layer 3 includes the first pixel defining sub-layer 31 and the second pixel defining sub-layer 32, that is, there is an overlapped region between an orthographic projection of the second pixel defining sub-layer 32 on the base 1 and an orthographic projection of each quantum dot light-emitting layer 2 on the base 1 (i.e., a part of the surface of the quantum dot light-emitting layer 2 facing away from the base 1 is in contact with the second pixel defining sub-layer 32), along a direction from one quantum dot light-emitting layer 2 to another quantum dot light-emitting layer 2 adjacent thereto, a dimension of the overlapped region is of 500 nm to 1000 nm, inclusive. For example, the dimension of the overlapped region is 500 nm, 800 nm or 1000 nm.

By setting the orthographic projection of the second pixel defining sub-layer 32 on the base 1 and the orthographic projection of each quantum dot light-emitting layer 2 on the base 1 to have the overlapped region, the presence of a gap between the second pixel defining sub-layer 32 and each quantum dot light-emitting layer 2 or the presence of a gap between the second pixel defining sub-layer 32 and each first electrode 4 because of technical causes may be avoided. Thus, the electrical connection of the second electrode 5 to the first electrode 4 by the gap, which may influence the normal display of the array substrate 100, may be avoided.

In some embodiments, referring to FIGS. 7 and 8, the pixel defining layer 3 further includes a third pixel defining sub-layer 33 disposed on a side of the first pixel defining sub-layer 31 proximate to the base 1. The third pixel defining sub-layer 33 includes an insulating layer. The first pixel defining sub-layer 31 covers an outer surface of the third pixel defining sub-layer 33. Here, the outer surface refers to the exposed surface of the third pixel defining sub-layer 33, which at least includes a surface of the third pixel defining sub-layer 33 facing away from the base 1 and a surface of the third pixel defining sub-layer 33 proximate to each quantum dot light-emitting layer 2 and each first electrode 4.

The thickness of the first pixel defining sub-layer 31 in a direction parallel to the base 1 (i.e., the dimension of the boundary of the orthographic projection of the first pixel defining layer 31 on the base 1 exceeding the boundary of the orthographic projection of the third pixel defining sub-layer 33 on the base 1) is set according to actual requirements and will not be limited in some embodiments of the present disclosure. For example, the thickness of the first pixel defining sub-layer 31 in the direction parallel to the base 1 is of 0.1 μm to 1 μm, inclusive, for example, 0.5 μm.

In some embodiments of the present disclosure, in a case where the dimension of the pixel defining layer 3 in the direction parallel to the base 1 is constant and the dimension of the second pixel defining sub-layer 32 in the direction parallel to the base 1 is constant by setting the third pixel defining sub-layer 33 between the first pixel defining sub-layer 31 and the base 1, the dimension of the first pixel defining sub-layer 31 in the direction parallel to the base 1 may be reduced. Since the insulating material has a lower density and weight than the metal material, the weight of the first pixel defining sub-layer 31 may be reduced. Thus, the overall weight of the pixel defining layer 3 may be reduced. The adverse effect on the base 1 is avoided.

Some embodiments of the present disclosure provide a method of manufacturing an array substrate. This method is used for manufacturing the array substrate 100 described in the above some embodiments. Referring to FIGS. 1 to 4, the method of manufacturing the array substrate includes S100 to S300.

Figure 2:
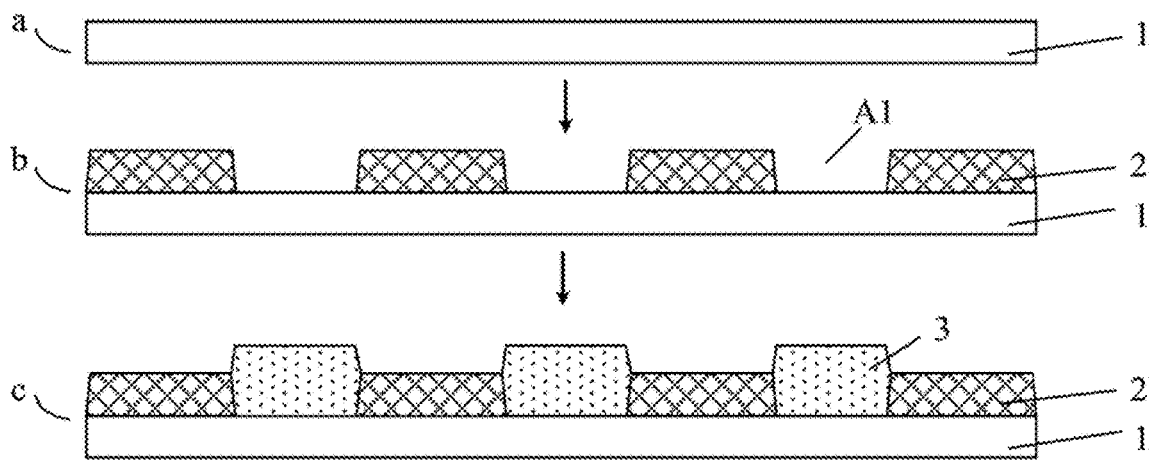
FIG. 2 is a diagram showing processes of manufacturing an array substrate, according to some embodiments of the present disclosure.
Figure 3:
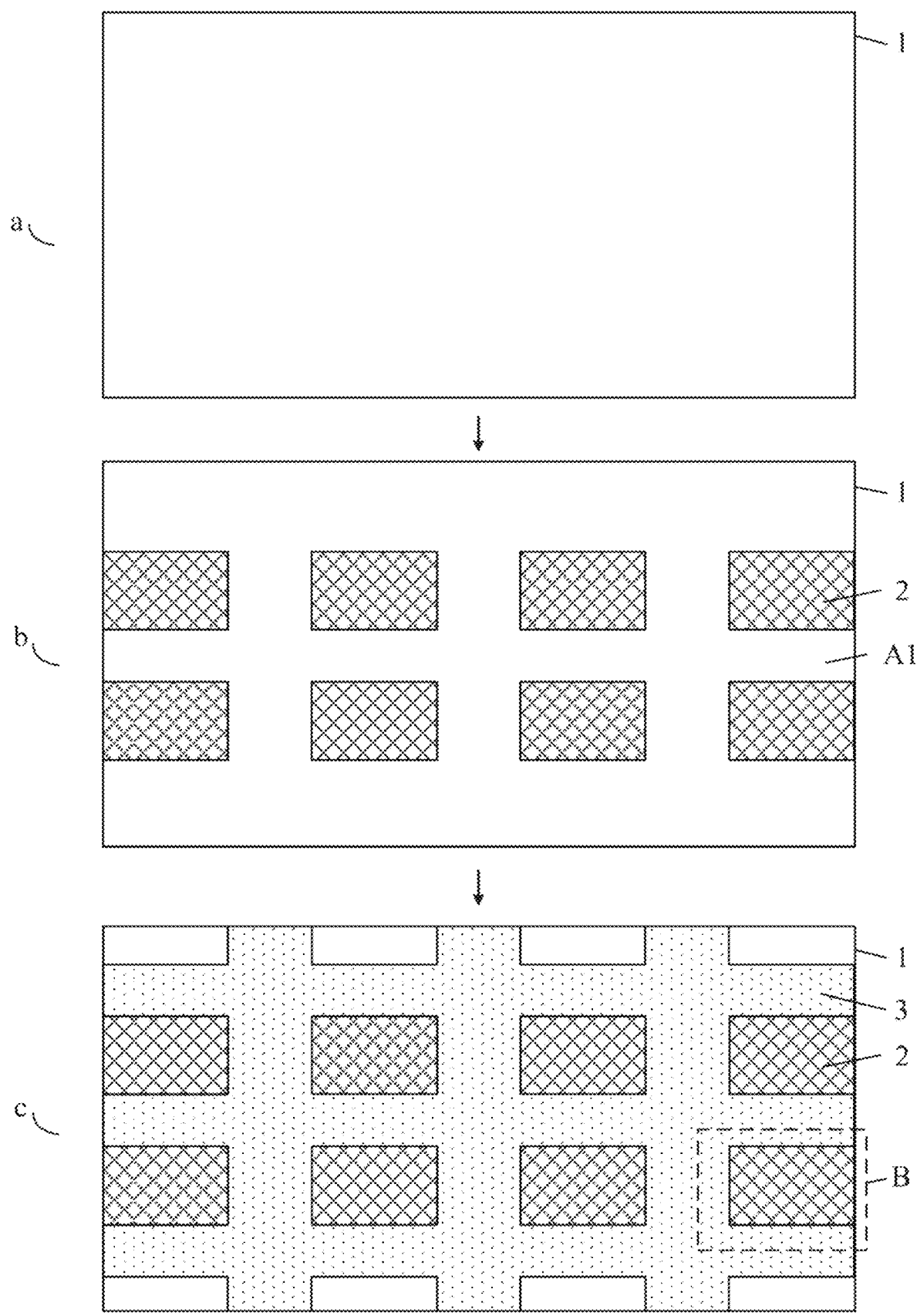
FIG. 3 is a diagram showing processes of manufacturing another array substrate, according to some embodiments of the present disclosure.
Figure 4:
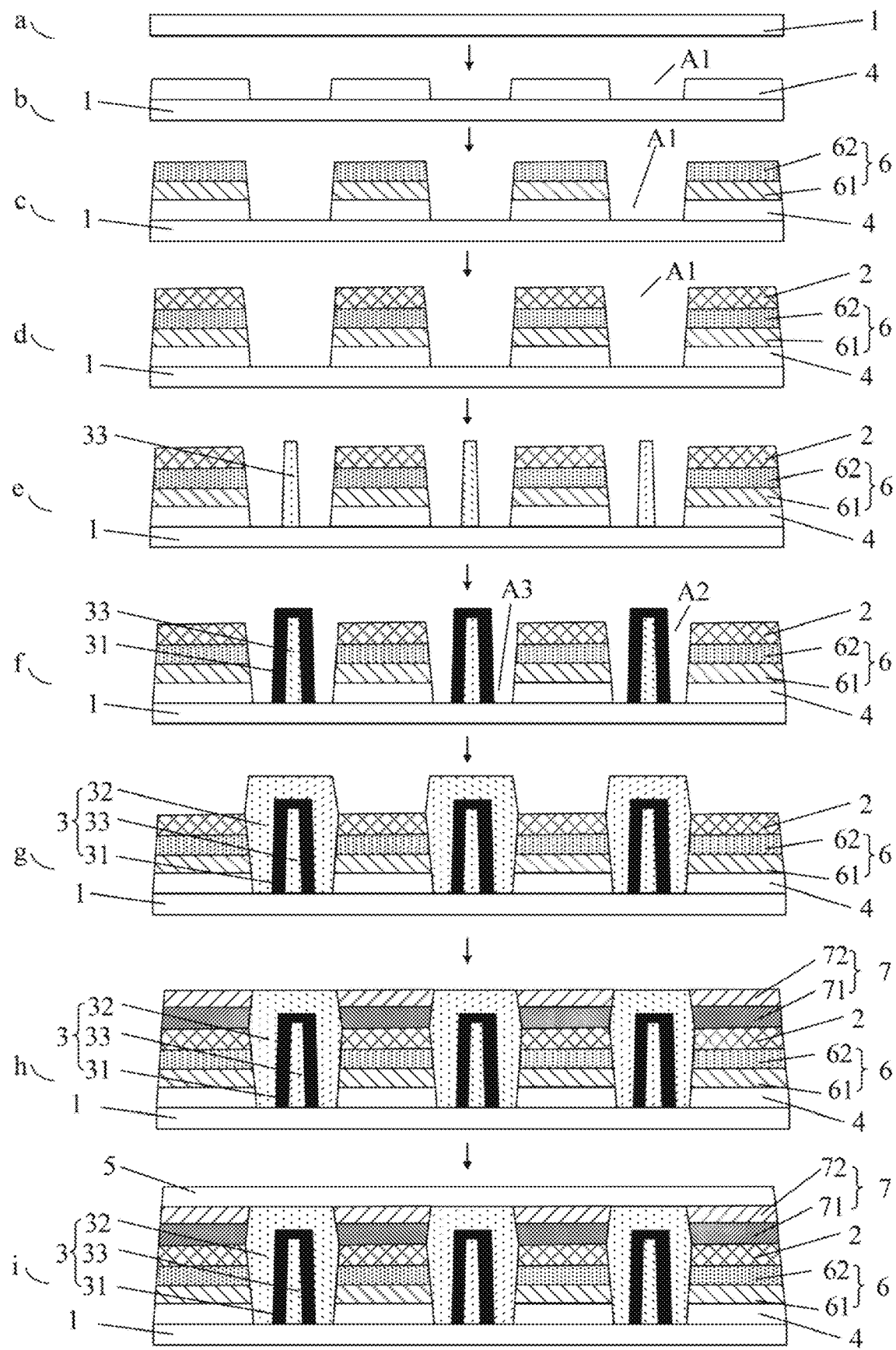
FIG. 4 is a diagram showing processes of manufacturing yet another array substrate, according to some embodiments of the present disclosure.

In S100, as shown in a of FIG. 2, a of FIG. 3 and a of FIG. 4, a base 1 is provided.

The base 1 may be selected according to actual requirements and will not be limited in some embodiments of the present disclosure.

In S200, as shown in b of FIG. 2 and b of FIG. 3, a plurality of quantum dot light-emitting layers 2 arranged in an array are formed on a side of the base 1. The plurality of quantum dot light-emitting layers 2 are in one-to-one correspondence with a plurality of sub-pixel regions B of the array substrate 100. There is a first space A1 between every two adjacent quantum dot light-emitting layers 2 of the plurality of quantum dot light-emitting layers 2. That is, there is a certain distance between every two adjacent quantum dot light-emitting layers 2. The adjacent quantum dot light-emitting layers 2 are not connected to each other and are disposed independently. The plurality of first spaces A1 are communicated with each other to form a grid.

In some embodiments, forming the plurality of quantum dot light-emitting layers 2 in S200 includes: forming, on a side of the base 1, a quantum dot film, and patterning the quantum dot film to form the plurality of quantum dot light-emitting layers 2.

Here, the quantum dot material for the quantum dot light-emitting layers 2 includes a plurality of quantum dots and ligands respectively bonded to the plurality of quantum dots. The process steps for forming the plurality of quantum dot light-emitting layers 2 by using photolithography are related to the material for the ligands.

In some examples, the quantum dot material includes a photosensitive quantum dot material. That is, the ligands include photosensitive ligands that are sensitive to light.

Exemplarily, the material for the photosensitive ligands includes a photo-curable material, for example, the photo-curable material includes at least one of an alkenyl group, an alkynyl group, a phenyl group, a sulfhydryl group or a hydroxyl group. When irradiated by light (e.g., UV light), each of the plurality of functional groups may react to form a crosslinked grid structure. Thus, the photosensitive quantum dot material may be cured.

Here, for example, the chemical structural formulas of photosensitive ligands include at least one of:

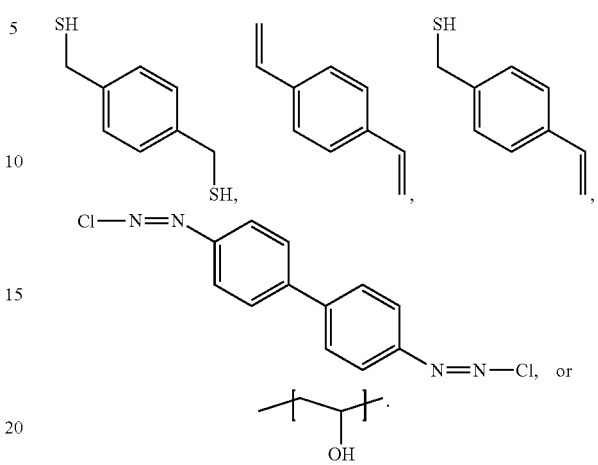

Exemplarily, the material for the photosensitive ligands includes a photo-degradable material, for example, the photo-degradable material includes at least one of a carbonyl group or an epoxy group. When irradiated by light (e.g., UV light), each of the plurality of functional groups may have chain scission or degradation reaction. Thus, the photosensitive quantum dot material may be degraded.

Here, for example, the chemical structural formulas of photosensitive ligands include:

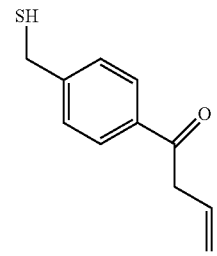

Here, the plurality of quantum dot light-emitting layers 2 are formed by using photolithography, including S210 to S220.

In S210, a quantum dot film is formed on a side of the base 1 by using a photosensitive quantum dot material.

For example, a whole layer of quantum dot film is formed above the base 1 by inkjet printing, spraying or spin-coating. This quantum dot film has a uniform thickness in its all parts (i.e., the dimension of all parts of the quantum dot film in a direction perpendicular to the base 1 is uniform). In this way, the subsequently obtained plurality of quantum dot light-emitting layers 2 may have good uniformity in thickness.

In S220, the quantum dot film is exposed by using a mask, and the exposed quantum dot film is developed to obtain the plurality of quantum dot light-emitting layers 2.

Here, in a case where the material for photosensitive ligands includes a photo-curable material, exposing and developing the quantum dot film is specifically: providing a mask on a side of the quantum dot film facing away from the base 1, the mask including film reservation regions (i.e., regions that do not shield corresponding parts in the quantum dot film) and film removal regions (i.e., regions shielding corresponding parts in the quantum dot film), exposing the parts of the quantum dot film corresponding to the film reservation regions to cure these parts, and then developing the quantum dot film to remove the parts of the quantum dot film corresponding to the film removal regions. The reserved parts of the quantum dot film (i.e., the cured parts) are the quantum dot light-emitting layers 2.

Here, in a case where the material for photosensitive ligands includes a photo-degradable material, exposing and developing the quantum dot film is specifically: providing a mask on a side of the quantum dot film facing away from the base 1, the mask including film reservation regions (i.e., regions shielding corresponding parts in the quantum dot film) and film removal regions (i.e., regions that do not shield corresponding parts in the quantum dot film), exposing the parts of the quantum dot film corresponding to the film removal regions to degrade these parts, and then developing the quantum dot film to remove the parts of the quantum dot film corresponding to the film removal regions. The undegraded parts of the quantum dot film are the plurality of quantum dot light-emitting layers 2.

Here, in the case where the material for photosensitive ligands includes a photo-curable material, and in the case where the material for photosensitive ligands includes a photo-degradable material, the used developing materials are different.

In addition, after exposing and developing the quantum dot film, the quantum dot light-emitting layers 2 are usually shaped by post-baking to stabilize structures of the quantum dot light-emitting layers 2.

In some examples, the quantum dot material includes a non-photosensitive quantum dot material. That is, the ligands include non-photosensitive ligands. Here, the plurality of quantum dot light-emitting layers 2 are formed by using photolithography, including S210' to S240'.

In S210', a quantum dot film is formed on a side of the base 1 by using non-photosensitive quantum dot material.

Here, the process of forming a quantum dot film by using a non-photosensitive quantum dot material is usually the same as the process of forming a quantum dot film by using a photosensitive quantum dot material in the above same embodiments.

In S220', a first photoresist layer is formed on s surface of the quantum dot film facing away from the base 1.

In S230', the first photoresist layer is exposed by using a mask, and the exposed first photoresist layer is developed to form a patterned first photoresist layer.

The first photoresist layer includes a positive photoresist layer or a negative photoresist layer. Here, in a case where a pattern formed by subsequently etching the quantum dot film corresponding to the positive photoresist layer and a pattern formed by subsequently etching the quantum dot film corresponding to the negative photoresist layer are the same, a pattern of the patterned first photoresist layer, which is obtained by using the positive photoresist layer, is opposite to a pattern of the patterned first photoresist layer, which is obtained by using the negative photoresist layer.

In S240', the quantum dot film is etched by using the patterned first photoresist layer as a mask to obtain the plurality of quantum dot light-emitting layers 2.

After forming the plurality of quantum dot light-emitting layers 2 in S200, the method of manufacturing the array substrate further includes S300.

In S300, as shown in c of FIG. 2, c of FIG. 3 and e-g of FIG. 4, the pixel defining layer 3 is formed in the plurality of first spaces A1. The pixel defining layer 3 is configured to define sub-pixel regions B, that is, a part of the pixel defining layer 3 is disposed between any two adjacent quantum dot light-emitting layers 2.

The material for the pixel defining layer 3 is diverse and may be selected according to actual requirements, and will not be limited in some embodiments of the present disclosure. In some examples, the material for the pixel defining layer 3 includes an insulating material. Exemplarily, the insulating material includes an inorganic insulating material, for example, $SiO_x$, SiON or $SiN_x$. Or, the insulating material includes an organic insulating material, for example, a photosensitive resin material, and the photosensitive resin material includes positive photoresist resin or negative photoresist resin.

The process steps for forming the pixel defining layer 3 are usually related to the material for the pixel defining layer 3. The process steps for forming the pixel defining layer 3 will be described exemplarily, by taking a case where the material for the pixel defining layer 3 includes an inorganic insulating material and a case where the material for the pixel defining layer 3 includes an organic insulating material.

For example, the material for the pixel defining layer 3 includes an inorganic insulating material, in S300, the process steps for forming the pixel defining layer 3 include S310 to S330.

In S310, a pixel defining film is formed on surfaces of the plurality of quantum dot light-emitting layers 2 facing away from the base 1 and in the plurality of first spaces A1.

For example, the pixel defining film is deposited by plasma enhanced chemical vapor deposition (PECVD).

In S320, a second photoresist layer is formed on a surface of the pixel defining film facing away from the base 1, and the second photoresist layer is exposed and developed to form a patterned second photoresist layer.

In S330, the pixel defining film is etched by using the patterned second photoresist layer as a mask to form the pixel defining layer 3.

For example, the pixel defining film is etched by reactive ion etching (RIE) or inductively coupled plasma (ICP).

Here, taking the second photoresist layer being a positive photoresist layer as an example, parts of the pixel defining film corresponding to the plurality of first spaces A1 are shielded by the patterned second photoresist layer, and parts of the pixel defining film corresponding to the plurality of quantum dot light-emitting layers 2 are exposed. In this way, during the etching of the pixel defining film, the parts of the pixel defining film corresponding to the plurality of quantum dot light-emitting layers 2 may be removed, and the parts of the pixel defining film corresponding to the plurality of first spaces A1 may be reserved. It is also convenient to obtain the pixel defining layer 3.

For example, the material for the pixel defining layer 3 includes an organic insulating material. Taking the organic insulating material being positive photoresist resin as an example, in S300, the process steps for forming the pixel defining layer 3 include S310' to S320'.

In S310', a pixel defining film is formed on surfaces of the plurality of quantum dot light-emitting layers 2 facing away from the base 1 and in the plurality of first spaces A1.

In S320', parts of the pixel defining film corresponding to the plurality of quantum dot light-emitting layers 2 are exposed and developed, and parts of the pixel defining film corresponding to the plurality of first spaces A1 are reserved to form the pixel defining layer 3.

In the method of manufacturing the array substrate provided in these embodiments of the present disclosure, by forming a quantum dot film that is uniform in thickness on a side of the base 1, and etching the quantum dot film to form a plurality of quantum dot light-emitting layers 2 that are uniform in thickness, and then forming a pixel defining layer 3 in the plurality of first spaces A1 used to separate every two adjacent quantum dot light-emitting layers 2, the climbing of the quantum dot light-emitting layers 2 onto the pixel defining layer 3 may be avoided. That is, it is ensured that the quantum dot light-emitting layers 2 may have good uniformity in thickness. Thus, the yield of the QLED display device may be ensured. Furthermore, in the case where the array substrate 100 is applied to the high-resolution QLED display device, the climbing of the quantum dot light-emitting layers 2 onto the pixel defining layer 3 may be avoided. Thus, the yield of the high-resolution QLED display device may be increased.

It should be noted that, in an array substrate corresponding to an organic light emitting diodes (OLEDs), a light-emitting layer in each OLED is usually formed by evaporation. Therefore, the light-emitting layer will not be non-uniform in thickness. Thus, in some embodiments of the present disclosure, during the manufacturing of the array substrate 100, a plurality of quantum dot light-emitting layers 2 are formed first and a pixel defining layer 3 is then formed. In this way, the non-uniform thickness of the quantum dot light-emitting layers 2 may be avoided.

The light emitting of the quantum dot light-emitting layer 2 is usually driven by a driving voltage. That is, by a driving voltage, the quantum dot light-emitting layer 2 is excited to emit light.

On this basis, in some examples, in S200, forming, on a side of the base 1, a plurality of quantum dot light-emitting layers 2 arranged in an array, further includes S201 to S202.

In S201, as shown in b of FIG. 4, a plurality of first electrodes 4 arranged in an array are formed on a side of the base 1.

The plurality of first electrodes 4 are in one-to-one correspondence with the plurality of sub-pixel regions B of the array substrate 100. The plurality of first electrodes 4 are disposed independently and not in electrical connection with each other. That is to say, in some embodiments of the present disclosure, the sub-pixel regions B of the array substrate 100 are defined by the formed plurality of first electrodes 4. The plurality of first electrodes 4 have high preparation precision.

In addition, after forming the first electrodes 4 on a side of the base 1, the surface of the array substrate may be treated by plasma and cleaned, so as to ensure that each first electrode 4 is independent of each other, in order to avoid the electrical connection of two adjacent first electrodes 4.

In S202, as shown in d of FIG. 4, a quantum dot light-emitting layer 2 is formed on a side of each first electrode 4 facing away from the base 1.

In some examples, an orthographic projection of the quantum dot light-emitting layer 2 on the base 1 and an orthographic projection of a corresponding first electrode 4 on the base 1 are overlapped. The first electrode 4 usually has a small thickness (i.e., the dimension of the first electrode 4 in a direction perpendicular to the base 1), and the first space A1 between every two adjacent quantum dot light-emitting layers 2 includes a part extending to between every two adjacent first electrodes 4.

In some examples, as shown in i of FIG. 4, after the S300, the method of manufacturing the array substrate further includes: forming a second electrode 5 on a side of each quantum dot light-emitting layer 2 facing away from the base 1.

Here, in the case where each first electrode 4 is an anode, a corresponding second electrode 5 is a cathode; and in the case where each first electrode 4 is a cathode, the corresponding second electrode 5 is an anode.

In some examples, the second electrodes 5 form an integral structure. That is, the second electrodes 5 form an electrode layer that is integrally laid on a surface of the pixel defining layer 3 facing away from the base 1 and on surfaces of the plurality of quantum dot light-emitting layers 2 facing away from the base 1.

In this way, a driving voltage may be formed between each first electrode 4 and the corresponding second electrode 5. By the driving voltage, a corresponding quantum dot light-emitting layer 2 is excited to emit light.

In some embodiments, in S300, the structure of the formed pixel defining layer 3 is diverse, and there are many ways of forming the pixel defining layer 3, correspondingly. The way of forming the pixel defining layer 3 may be selected according to actual requirements and will not be limited in some embodiments of the present disclosure.

In some examples, in S300, forming a pixel defining layer 3 in the plurality of first spaces A1 includes S305 to S306.

In S305, as shown in f of FIG. 4, FIGS. 6 and 10, a first pixel defining sub-layer 31 is formed in the plurality of first spaces A1. There are second spaces A2 between the first pixel defining sub-layer 31 and each quantum dot light-emitting layer 2. The distance from a surface of the first pixel defining sub-layer 31 facing away from the base 1 to the base 1 is greater than the distance from the surface of the quantum dot light-emitting layer 2 facing away from the base 1 to the base 1. A material for the first pixel defining sub-layer 31 includes an opaque material.

In some examples, forming a first pixel defining sub-layer 31 in the plurality of first spaces A1 is specifically: depositing an opaque material layer by sputtering deposition, and patterning the opaque material layer. That is, the opaque material layer is etched in a single patterning process by using a mask to obtain the first pixel defining sub-layer 31.

Here, the first pixel defining sub-layer 31 is configured to absorb or reflect light. The material for the first pixel defining sub-layer 31 is diverse and may be selected according to actual requirements, and will not be limited in some embodiments of the present disclosure. For example, the first pixel defining sub-layer 31 is made of a highly reflective material (e.g., metal material). In this case, the first pixel defining sub-layer 31 is configured to reflect light. Or, the first pixel defining sub-layer 31 is made of a carbon-containing resin material. In this case, the first pixel defining sub-layer 31 is configured to absorb light.

In S306, as shown in g of FIG. 4, FIGS. 6 and 10, a second pixel defining sub-layer 32 is formed in all second spaces A2. A material for the second pixel defining sub-layer 32 includes an insulating material.

In some examples, the process steps for forming the second pixel defining sub-layer 32 in all second spaces A2 are related to the material for the second pixel defining sub-layer 32.

Exemplarily, the material for the second pixel defining sub-layer 32 includes an inorganic insulating material, for example, $SiO_x$, SiON or $SiN_x$. In this case, forming the second pixel defining sub-layer 32 in all second spaces A2 is specifically: depositing a second pixel defining sub-film by PECVD, and patterning the second pixel defining sub-film. That is, the second pixel defining sub-film is etched in a single patterning process by using a mask to obtain the second pixel defining sub-layer 32.

Exemplarily, the material for the second pixel defining sub-layer 32 includes an organic insulating material, for example, a photosensitive resin material. In this case, forming the second pixel defining sub-layer 32 in all second spaces A2 is specifically: forming a second pixel defining sub-film by coating, then exposing and developing the second pixel defining sub-film to obtain the second pixel defining sub-layer 32.

In some examples, the structure of the second pixel defining sub-layer 32 formed in all second spaces A2 is related to the material for the second pixel defining sub-layer 32.

For example, the material for the first pixel defining sub-layer 31 includes an opaque metal material, and there are third spaces A3 between the first pixel defining sub-layer 31 and each first electrode 4. In this case, in S306, forming a second pixel defining sub-layer 32 in all second spaces A2, further includes: forming a second pixel defining sub-layer 32 in all third spaces A3 and in all second spaces A2. In this way, the first pixel defining sub-layer 31 may be separated from and insulated from each first electrode 4 by the second pixel defining sub-layer 32, and the electrical connection of the first pixel defining sub-layer 31 to a certain first electrode 4 may be avoided.

For example, the material for the first pixel defining sub-layer 31 includes an opaque metal material, and there are third spaces A3 between the first pixel defining sub-layer 31 and each first electrode 4. In this case, in S306, forming a second pixel defining sub-layer 32 in all second spaces A2, further includes: forming a second pixel defining sub-layer 32 in all third spaces A3, in all second spaces A2 and on the surface of the first pixel defining sub-layer 31 facing away from the base 1. In this way, the first pixel defining sub-layer 31 may be wrapped by the second pixel defining sub-layer 32. The first pixel defining sub-layer 31 is separated from other electrically conductive structures (e.g., the second electrodes 5), so as to ensure that the first pixel defining sub-layer 31 is insulated from other electrically conductive structures.

In some examples, in S300, forming a pixel defining layer 3 in the plurality of first spaces A1 further includes S301 to S302.

In S301, as shown in e of FIG. 4, a third pixel defining sub-layer 33 is formed in the first spaces A1. The third pixel defining sub-layer 33 is made of an insulating material.

Here, the third pixel defining sub-layer 33 and the second pixel defining sub-layer 32 may be made of a same material or different materials.

In a case where the third pixel defining sub-layer 33 and the second pixel defining sub-layer 32 are made of a same material, the process steps for forming the third pixel defining sub-layer 33 are the same as those for forming the second pixel defining sub-layer 32.

In S302, as shown in f of FIG. 4, a first pixel defining sub-layer 31 is formed on a side of the third pixel defining sub-layer 33 facing away from the base 1. The first pixel defining sub-layer 31 covers an outer surface of the third pixel defining sub-layer 33. Here, the outer surface refers to an exposed surface of the third pixel defining sub-layer 33, and the outer surface includes the surface of the third pixel defining sub-layer 33 facing away from the base 1 and the surface of the third pixel defining sub-layer 33 proximate to each quantum dot light-emitting layer 2 and each first electrode 4.

Here, the way of forming the first pixel defining sub-layer 31 is the same as that of forming the first pixel defining sub-layer 31 in S305.

The beneficial effects that may be realized by the method of forming the pixel defining layer 3 provided in some embodiments of the present disclosure are the same as those that may be realized by the pixel defining layer 3 provided in the above some embodiments, and will not be repeated here.

In some embodiments, as shown in c of FIG. 4, after forming the plurality of first electrodes 4 in S201, and before forming the plurality of quantum dot light-emitting layers 2 in S202, the method of manufacturing the array substrate further includes: forming a first function layer 6 on a side of each first electrode 4 facing away from the base 1. As shown in H of FIG. 4, after forming the plurality of quantum dot light-emitting layers 2 in S202, and before forming the second electrodes 5, the method of manufacturing the array substrate further includes: forming a second function layer 7 on a side of each quantum dot light-emitting layer 2 facing away from the base 1.

In some examples, both the first function layer 6 and the second function layer 7 are made of a non-photosensitive material.

For example, the first electrode 4 is a cathode and the second electrode 5 is an anode. The first function layer 6 includes at least one of an electron injection layer or an electron transport layer, and the second function layer 7 includes at least one of a hole transport layer or a hole injection layer.

Here, forming a first function layer 6 is specifically: forming a first function film by spin-coating or magnetron sputtering, and etching the first function film to obtain the first function layer 6. Or, the first function layer 6 is formed by spin-coating or magnetron sputtering (i.e., the first function layer 6 is planar). In addition, in some examples, the electron transport layer 62 is made of ZnO nanoparticles.

Forming a second function layer 7 is specifically: forming a whole second function layer 7 on a side of each quantum dot light-emitting layer 2 facing away from the base 1.

In other examples, at least one of the first function layer 6 or the second function layer 7 includes a photosensitive function layer that is sensitive to light. For example, a material for the photosensitive function layer includes at least one of an alkenyl group, an alkynyl group, a phenyl group, a sulfhydryl group, or a hydroxyl group, or includes at least one of a carbonyl group or an epoxy group.

Here, forming the photosensitive function layer includes: forming a photosensitive function film, and patterning the photosensitive function film by using photolithography to form the photosensitive function layer.

In some embodiments, before S100, the method of manufacturing the array substrate further includes: forming a pixel driving circuit in each sub-pixel region B. Each pixel driving circuit is electrically connected to a corresponding first electrode 4, and the pixel driving circuit includes at least one TFT 8 and/or at least one capacitor. In some examples, each TFT 6 is a bottom-gate TFT. In other examples, each TFT 8 is a top-gate TFT.

For example, each TFT 8 is a bottom-gate TFT as shown in FIG. 11. Forming the TFT 8 includes S401 to S405.

In S401, a first metal film is formed on a side of the base 1, and the first metal film is patterned to form a gate.

Here, at the same time of forming the gate, a gate line electrically connected to the gate may be formed. That is, the gate and the gate line are formed by patterning a same first metal film.

In some examples, the first metal film is made of a metal material such as Mo, Cu or Al. The gate has a thickness of 100 nm to 300 nm, inclusive, for example, 200 nm.

In S402, a gate insulating layer is formed on a side of the gate facing away from the base 1.

Here, the gate insulating layer is made of insulating materials such as $SiO_2$. The gate insulating layer has a thickness of 75 nm to 225 nm, inclusive, for example, 150 nm.

In S403, an active layer is formed on a side of the gate insulating layer facing away from the base 1.

Here, the active layer is usually made of amorphous silicon, metallic oxide, polycrystalline silicon or an organic material. For example, the active layer is made of indium gallium zinc oxide (IGZO). The active layer has a thickness of 20 nm to 60 nm, inclusive, for example, 40 nm.

In S404, a second metal film is formed on a side of the active layer facing away from the base 1, and the second metal film is patterned to form a source and a drain.

In some examples, at the same time of forming the source and the drain, a data line electrically connected to the source may be formed. That is, the source, the drain and the data line are formed by patterning a same second metal film.

Here, the second metal film is made of a metal material such as Mo, Cu or Al; or, the second metal film is made of a transparent electrically-conductive material such as indium tin oxide (ITO) or indium zinc oxide (IZO). The formed source and drain have a thickness of 100 nm to 300 nm, inclusive, for example, 200 nm.

In S405, a passivation layer is formed on a side of the source facing away from the base 1, on a side of the drain facing away from the base 1, and on a side of the active layer facing away from the base 1.

Here, the passivation layer is usually made of an insulating material such as $SiO_2$. The passivation layer has a thickness of 200 nm to 400 nm, inclusive, for example, 300 nm.

By the formation of the passivation layer, a surface on the TFT 8 facing away from the base 1 may be flat, which is convenient for the completion of the subsequent processes (e.g., the formation of the first electrodes 4, the formation of the quantum dot light-emitting layers 2, etc.).

Some embodiments of the present disclosure provide a display device 200. As shown in FIG. 10, the display device 200 includes the array substrate 100 provided in the above embodiments. The array substrate 100 in the display device 200 has the same technical effects as the array substrate 100 in the above embodiments and will not be repeated here.

In some examples, the display device 200 may be any product or component, such as a mobile phone, a tablet, a laptop, a display, a display panel, a TV set, a digital photo frame, or a navigator, which have a display function.

For example, the display device 200 is a display panel. Here, during the manufacturing of the display panel, usually, a mother board is manufactured first, and the mother board is then cut to a plurality of display panels. On this basis, the display panel further includes an encapsulating cover plate configured to encapsulate the array substrate 100 to avoid erosion of moisture or oxygen to the quantum dot light-emitting layer 2 in the array substrate 100.

In the description of the above implementations, the specific features, structures, materials, or characteristics may be combined in a proper manner in any one or more embodiments or examples.

The forgoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure.

What is claimed is:

1. A method of manufacturing an array substrate, comprising:

providing a base;

forming, on a side of the base, a quantum dot film by using a photosensitive quantum dot material;

exposing the quantum dot film by using a mask, and developing the exposed quantum dot film to obtain a plurality of quantum dot light-emitting layers arranged in an array; and forming a pixel defining layer in a plurality of first spaces;

wherein, the photosensitive quantum dot material includes a plurality of quantum dots and a plurality of photosensitive ligands respectively bonded to the plurality of quantum dots; wherein one of the plurality of photosensitive ligands includes at least one of an alkenyl group, an alkynyl group, a phenyl group, a sulfhydryl group, or a hydroxyl group; or, one of the plurality of photosensitive ligands includes at least one of a carbonyl group or an epoxy group; and the plurality of quantum dot light-emitting layers are separated from each other by the plurality of first spaces, there is a corresponding one of the plurality of first spaces between every two adjacent quantum dot light-emitting layers of the plurality of quantum dot light-emitting layers, and the plurality of first spaces are communicated with each other.

2. The method according to claim 1, wherein the plurality of photosensitive ligands includes at least one of an alkenyl group, an alkynyl group, a phenyl group, a sulfhydryl group, or a hydroxyl group, a chemical structural formula of the photosensitive ligand includes one of:

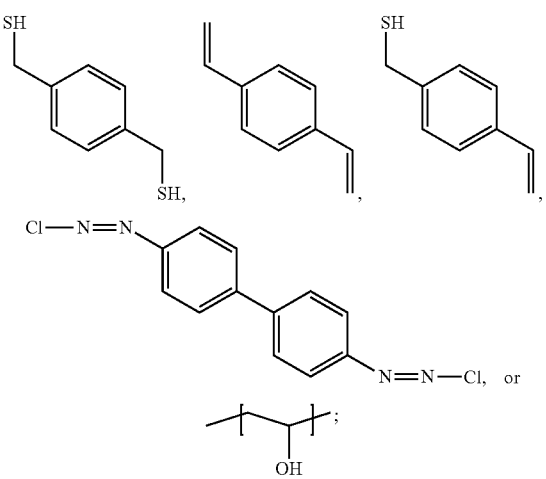

or in a case where one of the plurality of photosensitive ligands includes at least one of a carbonyl group or an epoxy group a chemical structural formula of the photosensitive ligand includes:

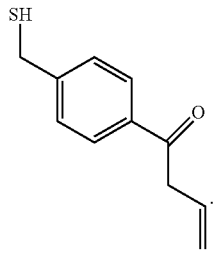

3. The method according to claim 1, wherein
before forming, on a side of the base, a plurality of quantum dot light-emitting layers arranged in an array, the method further comprises:
forming, on a side of the base, a plurality of first electrodes that are disposed between the base and the plurality of quantum dot light-emitting layers to be formed and are in one-to-one correspondence with the quantum dot light-emitting layers to be formed;
after forming a pixel defining layer in the plurality of first spaces, the method further comprises:
forming a second electrode on a side of each quantum dot light-emitting layer facing away from the base.

4. The method according to claim 3, wherein forming a pixel defining layer in the plurality of first spaces, includes:
forming a first pixel defining sub-layer in the plurality of first spaces, wherein the first pixel defining sub-layer is separated from the plurality of quantum dot light-emitting layers by a plurality of second spaces, there are some of the plurality of second spaces between the first pixel defining sub-layer and each quantum dot light-emitting layer, a distance from a surface of the first pixel defining sub-layer facing away from the base to the base is greater than or equal to a distance from a surface of the quantum dot light-emitting layer facing away from the base to the base, and a material for the first pixel defining sub-layer includes an opaque material; and
forming a second pixel defining sub-layer in the plurality of second spaces, wherein a material for the second pixel defining sub-layer includes an insulating material.

5. The method according to claim 4, wherein
the opaque material for the first pixel defining sub-layer includes an opaque metal material, the first pixel defining sub-layer is separated from the plurality of first electrodes by a plurality of third spaces, and there are some of the plurality of third spaces between the first pixel defining sub-layer and each first electrode; and
forming a second pixel defining sub-layer in the plurality of second spaces, includes:
forming a second pixel defining sub-layer in the plurality of third spaces and in the plurality of second spaces.

6. The method according to claim 4, wherein
the opaque material for the first pixel defining sub-layer includes an opaque metal material, the first pixel defining sub-layer is separated from the plurality of first electrodes by a plurality of third spaces, and there are some of the plurality of third spaces between the first pixel defining sub-layer and each first electrode; and forming a second pixel defining sub-layer in the plurality of second spaces, includes:
forming a second pixel defining sub-layer in the plurality of third spaces, in the plurality of second spaces, and on the surface of the first pixel defining sub-layer facing away from the base.

7. The method according to claim 4, wherein
forming a pixel defining layer in the plurality of first spaces, further includes:
forming a third pixel defining sub-layer in the plurality of first spaces, wherein a material for the third pixel defining sub-layer includes an insulating material; and
forming a first pixel defining sub-layer in the plurality of first spaces, includes:
forming a first pixel defining sub-layer in the plurality of first spaces and on a side of the third pixel defining sub-layer facing away from the base, wherein the first pixel defining sub-layer covers an outer surface of the third pixel defining sub-layer.

8. The method according to claim 3, wherein
after forming the plurality of first electrodes, and before forming the plurality of quantum dot light-emitting layers, the method further comprises:
forming a first function layer on a side of each first electrode facing away from the base; and
after forming the plurality of quantum dot light-emitting layers, and before forming the second electrode, the method further comprises:
forming a second function layer on a side of each quantum dot light-emitting layer facing away from the base.

9. The method according to claim 8, wherein at least one of the first function layer or the second function layer includes a photosensitive function layer;
forming the photosensitive function layer, includes:
forming a photosensitive function film; and
patterning the photosensitive function film by using photolithography to form the photosensitive function layer.

10. The method according to claim 8, wherein the first function layer includes at least one of an electron injection layer or an electron transport layer, and the second function layer includes at least one of a hole injection layer or a hole transport layer; or, the first function layer includes at least one of a hole injection layer or a hole transport layer, and the second function layer includes at least one of an electron injection layer or an electron transport layer; wherein
forming a second function layer on a side of each quantum dot light-emitting layer facing away from the base, includes:
forming, by evaporation, a second function layer on a side of each quantum dot light-emitting layer facing away from the base.

11. An array substrate, comprising:
a base;
a plurality of quantum dot light-emitting layers arranged in an array, which are disposed on a side of the base, wherein the plurality of quantum dot light-emitting layers are separated from each other by a plurality of first spaces, there is a corresponding one of the plurality of first spaces between every two adjacent quantum dot light-emitting layers of the plurality of quantum dot light-emitting layers, and the plurality of first spaces are communicated with each other; and
a pixel defining layer disposed in the plurality of first spaces, wherein the pixel defining layer includes a first pixel defining sub-layer and a second pixel defining sub-layer, the first pixel defining sub-layer is separated from the plurality of quantum dot light-emitting layers by a plurality of second spaces, there are some of the plurality of second spaces between the first pixel defining sub-layer and each quantum dot light-emitting layer, and the second pixel defining sub-layer is disposed in the plurality of second spaces; a material for the first pixel defining sub-layer includes an opaque material, and a material for the second pixel defining sub-layer includes an insulating material; and a distance from a surface of each quantum dot light-emitting layer facing away from the base to the base is less than a distance from a surface of the first pixel defining sub-layer facing away from the base to the base; wherein the quantum dot light-emitting layer includes a plurality of quantum dots and a plurality of photosensitive ligands respectively bonded to the plurality of quantum dots.

12. The array substrate according to claim 11, further comprising: a plurality of first electrodes each disposed on a side of a corresponding one of the plurality of quantum dot light-emitting layers proximate to the base; wherein the material for the first pixel defining sub-layer includes an opaque metal material, and the first pixel defining sub-layer is separated from the plurality of first electrodes by a plurality of third spaces, there are some of the plurality of third spaces between the first pixel defining sub-layer and each first electrode; and the second pixel defining sub-layer is further disposed in the plurality of third spaces.

13. The array substrate according to claim 11, further comprising: a plurality of first electrodes each disposed on a side of a corresponding one of the plurality of quantum dot light-emitting layers proximate to the base; wherein the material for the first pixel defining sub-layer includes an opaque metal material, and the first pixel defining sub-layer is separated from the plurality of first electrodes by a plurality of third spaces, there are some of the plurality of third spaces between the first pixel defining sub-layer and each first electrode; and the second pixel defining sub-layer is further disposed in the plurality of third spaces and on the surface of the first pixel defining sub-layer facing away from the base.

14. The array substrate according to claim 11, wherein the pixel defining layer further includes a third pixel defining sub-layer; a material for the third pixel defining sub-layer includes an insulating material; and the first pixel defining sub-layer is disposed on a side of the third pixel defining sub-layer facing away from the base, and the first pixel defining sub-layer covers an outer surface of the third pixel defining sub-layer.

15. The array substrate according to claim 11, wherein there is an overlapped region between an orthographic projection of the second pixel defining sub-layer on the base and an orthographic projection of each quantum dot light-emitting layer on the base, and along a direction from one quantum dot light-emitting layer to another quantum dot light-emitting layer adjacent thereto, a dimension of the overlapped region is of 500 nm to 1000 nm, inclusive.

16. A display device, comprising the array substrate according to claim 11.

17. A method of manufacturing an array substrate, comprising:

providing a base;

forming, on a side of the base, a quantum dot film by using a non-photosensitive quantum dot material;

forming a first photoresist layer on a surface of the quantum dot film facing away from the base;

exposing the first photoresist layer by using a mask, and developing the exposed first photoresist layer to form a patterned first photoresist layer; and etching the quantum dot film by using the patterned first photoresist layer as a mask to obtain a plurality of quantum dot light-emitting layers arranged in an array;

forming a pixel defining layer in a plurality of first spaces;

wherein the plurality of quantum dot light-emitting layers are separated from each other by the plurality of first spaces, there is a corresponding one of the plurality of first spaces between every two adjacent quantum dot light-emitting layers of the plurality of quantum dot light-emitting layers, and the plurality of first spaces are communicated with each other.

* * * * *